(12) United States Patent
Klipp et al.

(10) Patent No.: US 10,385,295 B2
(45) Date of Patent: *Aug. 20, 2019

(54) COMPOSITIONS FOR ANTI PATTERN COLLAPSE TREATMENT COMPRISING GEMINI ADDITIVES

(71) Applicant: BASF SE, Ludwigshafen (DE)

(72) Inventors: Andreas Klipp, Lambsheim (DE);
Andrei Honciuc, Ludwigshafen (DE);
Guenter Oetter, Frankenthal (DE);
Christian Bittner, Bensheim (DE)

(73) Assignee: BASF SE, Ludwigshafen (DE)

( * ) Notice: Subject to any disclaimer, the term of this patent is extended or adjusted under 35 U.S.C. 154(b) by 153 days.

This patent is subject to a terminal disclaimer.

(21) Appl. No.: 14/412,737

(22) PCT Filed: Jul. 1, 2013

(86) PCT No.: PCT/IB2013/055392
§ 371 (c)(1),
(2) Date: Jan. 5, 2015

(87) PCT Pub. No.: WO2014/009847
PCT Pub. Date: Jan. 16, 2014

(65) Prior Publication Data
US 2015/0159123 A1 Jun. 11, 2015

Related U.S. Application Data

(60) Provisional application No. 61/669,686, filed on Jul. 10, 2012.

(51) Int. Cl.
| | | |
|---|---|---|
| *C11D 1/62* | (2006.01) | |
| *C11D 11/00* | (2006.01) | |
| *C11D 1/40* | (2006.01) | |
| *C11D 1/00* | (2006.01) | |
| *G03F 7/20* | (2006.01) | |
| *G03F 7/32* | (2006.01) | |
| *G03F 7/40* | (2006.01) | |

(52) U.S. Cl.
CPC .......... *C11D 11/0047* (2013.01); *C11D 1/008* (2013.01); *C11D 1/40* (2013.01); *C11D 1/62* (2013.01); *G03F 7/2041* (2013.01); *G03F 7/322* (2013.01); *G03F 7/40* (2013.01)

(58) Field of Classification Search
CPC .......... G03F 7/322; G03F 7/405; C11D 1/62; C11D 1/40; C11D 1/008
USPC ................................. 430/435, 432
See application file for complete search history.

(56) References Cited

U.S. PATENT DOCUMENTS 6,670,107 B2 12/2003 Lachowski
9,557,652 B2 * 1/2017 Klipp .................... C11D 1/835

2004/0053172 A1 3/2004 Zhang et al.
2004/0259371 A1 12/2004 Lu
2006/0166130 A1 * 7/2006 Ogata .................... G03F 7/0046
430/270.1
2008/0280230 A1 11/2008 Chang et al.
2008/0299487 A1 12/2008 Chang
2010/0248164 A1 9/2010 Kumagai et al.
2013/0288484 A1 10/2013 Klipp et al.
2014/0011366 A1 1/2014 Klipp et al.

FOREIGN PATENT DOCUMENTS

| CN | 101766973 A | 7/2010 |
|---|---|---|
| EP | 1 389 746 | 2/2004 |
| EP | 1 553 454 A2 | 7/2005 |
| JP | 2009-237168 | 10/2009 |
| JP | 2009-237169 A | 10/2009 |

OTHER PUBLICATIONS

International Search Report and Written Opinion dated Nov. 21, 2013 in PCT/IB2013/055392.
Hideo Namatsu, et al., "Dimensional limitations of silicon nanolines resulting from pattern distortion due to surface tension of rinse water", App. Phys. Lett. vol. 66, No. 20, May 15, 1995, pp. 2655-2657.
U.S. Appl. No. 13/979,076, filed Jul. 10, 2013, US2013/0288484 A1, Klipp, et al.
U.S. Appl. No. 14/005,746, filed Sep. 17, 2013, US2014/0011366 A1, Klipp, et al.
Office Action and Search Report dated Apr. 25, 2017, in Taiwanese patent application No. 102124316 (w/English translation).

* cited by examiner

*Primary Examiner* — Daborah Chacko-Davis
(74) *Attorney, Agent, or Firm* — Oblon, McClelland, Maier & Neustadt, L.L.P.

(57) ABSTRACT

A method of reducing defects of a semiconductor substrate whereby the substrate is rinsed with an aqueous composition containing a gemini additive of the general formula I after the development of a photoresist or a photolithographic mask

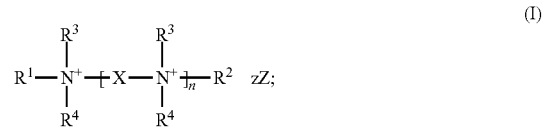

wherein X is a divalent group, $R^1$, $R^2$, $R^3$ and $R^4$ are substituted or unsubstituted monovalent groups, n is an integer from 1 to 5, or 1 to 10000 depending on $R^3$ and $R^4$, z is an integer, which is chosen so that the overall surfactant is electrically uncharged, and Z is a counter-ion.

16 Claims, 2 Drawing Sheets

COMPOSITIONS FOR ANTI PATTERN COLLAPSE TREATMENT COMPRISING GEMINI ADDITIVES

The present invention is directed to a composition useful in processes for manufacturing integrated circuits devices, optical devices, micromachines and mechanical precision devices, in particular for developing photoresists and post etch residue removal to avoid anti pattern collapse.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios.

Photolithography is a method in which a pattern on a mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm, through the mask. In order to extend the 193 nm photolithography to the 22 nm and the 15 nm technology node, immersion photolithography has been developed as a resolution enhancement technique. In this technique, the air gap between the final lens of the optical system and the photoresist surface is replaced by a liquid medium that has a refractive index greater than one, e.g., ultra pure water with a refractive index of 1.44 for the wavelength of 193 nm. However, in order to avoid leaching, water-uptake and pattern degradation, a barrier coating or a water resistant photoresist must be used. These measures however add to the complexity of the manufacturing process and are therefore disadvantageous.

Beside the 193 nm-immersion lithography other illumination techniques with significant shorter wavelength are considered to be solutions to fulfil the needs of further downscaling of the to be printed feature sizes of 20 nm node and below. Beside e-Beam exposure the Extreme Ultraviolet (EUV) Lithography with a wavelength of approx. 13.5 nm seem to be the most promising candidate to replace immersion lithography in the future. After exposure the subsequent process flow is quite similar for immersion and EUV lithography.

An optional post-exposure bake (PEB) is often performed to allow the exposed photoresist polymers to cleave. The substrate including the cleaved polymer photoresist is then transferred to a developing chamber to remove the exposed photoresist, which is soluble in aqueous developing compositions. Typically, such developing compositions comprise tetraalkylammonium hydroxides, such as but not limited to tetramethylammonium hydroxide (TMAH) are applied to the resist surface in the form of a puddle to develop the exposed photoresist. A deionized water rinse is then applied to the substrate to remove the dissolved polymers of the photoresists. The substrate is then sent to a spin drying process. Thereafter, the substrate can be transferred to the next process step, which may include a hard bake process to remove any moisture from the photoresist surface.

Irrespective of the exposure techniques the wet chemical processing of small patterns however involves a plurality of problems. As technologies advance and dimension requirements become stricter and stricter, photoresist patterns are required to include relatively thin and tall structures or features of photoresists, i.e., features having a high aspect ratio, on the substrate. These structures may suffer from bending and/or collapsing (so called pattern collapse), in particular, during the spin dry process, due to excessive capillary forces of the liquid or solution of the rinsing liquid deionized water remaining from the chemical rinse and spin dry processes and being disposed between adjacent photoresist features. The calculated maximum stress σ between small features caused by the capillary forces can be described according to Namatsu et al. Appl. Phys. Lett. 66(20), 1995 as follows:

$$\sigma = \frac{6 \cdot \gamma \cdot \cos\theta}{D} \cdot \left(\frac{H}{W}\right)^2$$

wherein γ is the surface tension of the fluid, θ is the contact angle of the fluid on the feature material surface, D is the distance between the features, H is the height of the features, and W is the width of the features.

To lower the maximum stress, generally the following approaches exist:
(a) lower the surface tension γ of the fluid,
(b) lower the contact angle of the fluid on the feature material surface.

In another approach to lower the maximum stress σ for immersion lithography may include using a photoresist with modified polymers to make it more hydrophobic. However, this solution may decrease the wettability of the developing solution.

Another problem of the conventional photolithographic process is line edge roughness (LER) and line width roughness (LWR) due to resist and optical resolution limits. LER includes horizontal and vertical deviations from the feature's ideal form. Especially as critical dimensions shrink, the LER and LWR become more problematic and may cause yield loss in the manufacturing process of IC devices.

Due to the shrinkage of the dimensions, the removal of particles in order to achieve a defect reduction becomes also a critical factor. This does not only apply to photoresist patterns but also to other patterned material layers, which are generated during the manufacture of optical devices, micromachines and mechanical precision devices.

An additional problem of the conventional photolithographic process is the presence of watermark defects. Watermarks may form on the photoresist as the deionized water or rinse liquid cannot be spun off from the hydrophobic surface of the photoresist. The photoresist may be hydrophobic particularly in areas of isolated, or non-dense, patterning. The watermarks have a harmful effect on yield and IC device performance.

However, besides the rinsing/cleaning step described above, also the swelling of the photoresist in the photoresist developing step may increase the risk of pattern collapse and should therefore be avoided.

EP 1 553 454 A2 discloses the use of cetylmethylammonium, stearylmethylammonium, cetyltrimethylammonium, stearyltrimethylammonium, distearyldimethylammonium, stearyldimethylbenzylammoium, dodecylmethylammonium, dodecyltrimethylammonium, benzylmethylammonium, benzyltrimethylammonium, and benzalkonium chloride as cationic surfactants in rinsing compositions for patterns having line-space dimensions of 90 nm.

U.S. Pat. No. 6,670,107 B2 discloses a method for the reduction of defects in an electronic device comprising of cationic and non-ionic surfactants in concentration less than or equal to the critical micelle concentration. US 2010/0248164 A1 discloses a rinse solution for preventing pattern collapse consisting of an anionic surfactant, an amine and water.

Patent application US 2000/53172 A1 discloses that the acetylenic diol-type of surfactant solutions prevent pattern collapse by making the surface of a photoresist hydrophilic thus improving the wettability of the rinse or solution.

In summary, pattern collapse may generally be caused by:
A. Swelling of the photoresist in the developing phase,
B. Capillary action of the rinsing/cleaning composition during the liquid spin-off at the end of the rinse,
C. Poor adhesion of the patterned structures to the underlayer,
D. Material incompatibility leading to swelling and weakening of the structures.

The present invention mainly addresses the problems under Lit. A and B, i.e. to prevent swelling of the photoresist and to prevent pattern collapse by using a defect reduction rinse after the development of the photoresist.

It is therefore an object of the present invention to provide a method for manufacturing integrated circuits for nodes of 50 nm and lower, in particular for nodes of 32 nm and lower and, especially, for nodes of 22 nm and lower, which method no longer exhibits the disadvantages of prior art manufacturing methods.

In particular, the compounds according to the present invention shall allow for the immersion photolithography of photoresist layers, the developing of the photoresist layers exposed to actinic radiation through a mask, the chemical rinse of patterned material layers comprising patterns with a high aspect ratio and line-space dimensions of 50 nm and less, in particular, of 32 nm and less, especially, of 22 nm and less, without causing pattern collapse, an increase of LER, LWR and watermark defects.

The components according to the present invention should allow for a significant reduction of LER and LWR by smoothing the roughness of the surfaces of the developed photoresist patterns. It should also allow for the efficient prevention and/or the removal of watermark defects on patterned material layers, in particular, but not limited to photoresist patterns. Furthermore it should allow for the efficient removal of particles in order to achieve a significant defect reduction on patterned material layers.

The components according to the present invention should also allow for a significant reduction of photoresist swelling.

SUMMARY OF THE INVENTION

A first embodiment of the present invention is the use of gemini additives of the general formula I in compositions for treating semiconductor substrates:

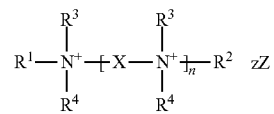

wherein:
X is a divalent group, for each repeating unit 1 to n independently selected from
(a) a linear or branched $C_1$ to $C_{20}$ alkanediyl, which may optionally be substituted and which may optionally be interrupted by up to 5 heteroatoms selected from O and N,
(b) a $C_5$ to $C_{20}$ cycloalkanediyl, which may optionally be substituted and which may optionally be interrupted by up to 5 heteroatoms selected from O and N,
(c) a $C_6$ to $C_{20}$ organic group of formula —$X^1$-A-$X^2$—, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which H atoms may optionally be substituted and which C atoms may optionally be interrupted by up to 5 heteroatoms selected from O and N,
(d) a polyoxyalkylene diradical of formula II:

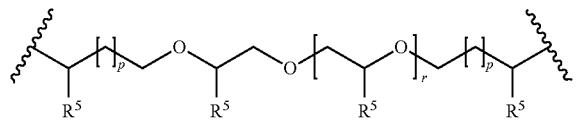

wherein p is 0 or 1, r is an integer from 1 to 100; $R^5$ is selected from H and a linear or branched $C_1$ to $C_{20}$ alkyl group;

$R^1$ and $R^2$ are monovalent groups independently selected from H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, or $C_2$ to $C_4$ oxyalkylene homo or copolymers, all of which may optionally be further substituted;

$R^3$ and $R^4$ are monovalent groups independently selected from a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ oxyalkylene homo or copolymers, all of which may optionally be substituted, and wherein pair-wise $R^3$—$R^4$ and adjacent $R^4$—$R^4$ and $R^3$—$R^3$ may optionally together form a bivalent group X as defined above, and may also be a continuation Q of the molecule by branching, and, if n is equal to or greater than 2, $R^3$, $R^4$ or $R^3$ and $R^4$ may also be hydrogen atoms;

n is an integer from 1 to 5, or, in case at least one of X, $R^3$ and $R^4$ comprising a $C_2$ to $C_4$ polyoxyalkylene group, n may be an integer from 1 to 10000, and provided that, if at least one Q is present, n includes all repeating units of branches Q;

Q is

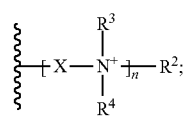

z is an integer, which is chosen so that the overall surfactant is electrically uncharged;

Z is a counter-ion.

According to another embodiment of the present invention a method for manufacturing integrated circuit devices, optical devices, micromachines and mechanical precision devices has been found, the said method comprising the steps of
(a) providing a substrate,
(b) providing the substrate with a photoresist layer,
(c) exposing the photoresist layer to actinic radiation through a mask with or without an immersion liquid,
(d) contacting the substrate at least once with a developing composition for developing the photoresist to obtain a pattern having line-space dimensions of 32 nm or less and an aspect ratio of 2 or more,
(e) contacting the substrate at least once with an aqueous cleaning composition,
wherein at least one of the developing composition of step (d) and the cleaning composition of step (e) comprises a gemini additive.

Advantages of the Invention

In view of the prior art, it was surprising and could not be expected by the skilled artisan that the objects of the invention could be solved by the use or method according to the invention.

It was surprising that the use of Gemini additives according to the invention allowed for the immersion photolithography of photoresist layers, the developing of photoresist layers exposed to actinic radiation through a mask, the cleaning of patterned material layers, or combinations thereof.

The surfactants according to the invention are particularly useful for pattern developing or cleaning developed photoresist layers comprising patterns having line-space dimensions of 50 nm or less, particularly of 32 nm or less and, most particularly 22 nm or less. Furthermore, the gemini additives according to the invention are particularly useful for aspect ratios greater or equal 2 in the case of photoresist structures, and, in particular, greater or equal 10 in the case of non-photoresist structures, without causing pattern collapse, line edge roughness (LER), line width roughness (LWR) and watermark defects in the photoresist case and anti pattern collapse, defect reduction and cleaning in the high aspect ratio case.

It has to be noted that the compositions comprising the gemini additives according to the present invention are generally useful for avoiding anti pattern collapse of photoresist structures as well as of non-photoresist patterns with high aspect ratios (HARS, typical aspect ratios are greater or equal 10).

Quite to the contrary, the method of the invention allowed for a significant reduction of LER and LWR by smoothing the roughness of the surfaces of the developed photoresist patterns, for the efficient prevention and/or the removal of watermark defects not only on photoresist patterns, but also on other patterned material layers, and the efficient removal of particles whereby a significant defect reduction not only on photoresist patterns but also on other patterned material layers could be achieved.

Without to be bound to any theory, it seems that the use of the gemini additives in the developer compositions could prevent swelling of the photoresist layer due to reduced diffusion. This also reduces the risk of pattern collapse of the photoresist during the subsequent steps. The use of the gemini additives in the developer solutions enables tuning surface tension and the interaction of the developer solution with the photo resist.

DETAILED DESCRIPTION OF THE INVENTION

The gemini-surfactants of the general formula I

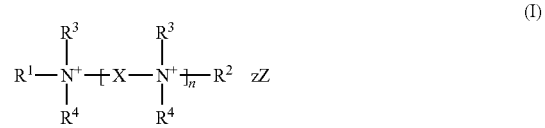

may advantageously used in the process for manufacturing IC devices but also for other devices to be provided with patterned structures of nm dimensions. The gemini additives may particularly be used in photoresist developing compositions as well as in cleaning or rinsing compositions during the photolithographic process in order to pattern semiconductor substrates. The terms rinsing and cleaning are use synonymously for the defect reduction rinsing step after the photoresist developing step.

Any customary and known substrates used for manufacturing IC devices, optical devices, micromachines and mechanical precision devices can be used in the process of the invention. Preferably, the substrate is a semiconductor substrate, more preferably a silicon wafer including a silicon-gallium wafer, which wafers are customarily used for manufacturing IC devices, in particular IC devices comprising ICs having LSI, VLSI and ULSI.

The composition is particularly suitable for treating substrates having patterned material layers having line-space dimensions of 50 nm and less, in particular, 32 nm and less and, especially, 22 nm and less, i.e. patterned material layers for the sub-22 nm technology nodes. The patterned material layers preferably have ratios above 2, preferably above 10, even more preferably above 50. In particular, when the patterned material layers comprise or consist of photoresist structures the ratios are above 2 and when they comprise or consist of non-photoresist structures the ratios are above 10. Most preferably, the aspect ratio is in the range of up to 75, as for example, for 15 nm flash devices.

The composition according to the present invention may be applied to substrates of any patterned material as long as structures tend to collapse due to their geometry.

By way of example, the patterned material layers may be
(a) a photoresist layer already exposed to radiation and developed with a developer solution,
(b) patterned barrier material layers containing or consisting of ruthenium, titanium nitride, tantalum or tantalum nitride,
(c) patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon and metals; and
d) patterned dielectric material layers containing or consisting of silicon dioxide or low-k or ultra-low-k dielectric materials.

The cleaning/rinsing compositions as well as the developer compositions comprising the gemini additives are preferably aqueous solutions.

Typically, the cleaning/rinsing compositions are used at a pH of about 6 to about 8.

Typically, the developing compositions are used at a pH of 8 or more, preferably at a pH of from 9 to 14.

"Aqueous" means that the solvent comprises water, preferably deionized water and, most preferably ultrapure water as the main solvent. The aqueous composition may contain water-miscible polar organic solvents, albeit only in such minor amounts that do not jeopardize the aqueous nature of the composition. It is preferred that the solvent essentially consists of water, preferably deionized water and, most preferably ultrapure water. Example of ultrapure water with concentration of 5 ppt (ng/kg), or better, anion concentration 5 ppb (ng/g), or better, total organic content (TOC) 50 ppb (ng/g), or better and contains particles of >0.2 mm under 10000 per ml.

The essential part of the additives according to the present invention is the gemini ammonium compound of the general formula Ia:

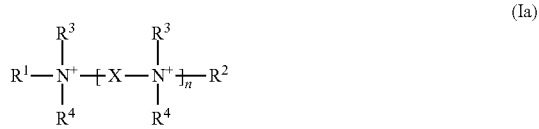
(Ia)

Furthermore, counterions Z have to be present for neutrality reasons. The ammonium compounds according to formula Ia are also referred to as "gemini additives" or "gemini surfactants".

In formula I, n may be an integer from 1 to 5. Preferably n is an integer from 1 to 3, most preferably n is 1.

However, in case at least one of X, $R^3$ and $R^4$ comprises oxyalkylene or polyoxyalkylene groups, the solubility in water is much better for higher molecular mass compounds and therefore n may be an integer from 1 up to 10000, In this case, preferably n may be an integer from 1 to 1000, more preferably from 1 to 100, even more preferably from 1 to 20, even more preferably from 1 to 3, and most preferably 1, provided that, if at least one Q is present, n includes all repeating units of branches Q.

In a first embodiment X may be a divalent group, for each repeating unit 1 to n independently selected from a linear or branched $C_1$ to $C_{20}$ alkanediyl, which may optionally be substituted and which may optionally be interrupted by up to 5 heteroatoms selected from O and N. In a preferred embodiment the linear or branched $C_1$ to $C_{20}$ alkanediyl may be selected from an unsubstituted linear or branched $C_1$ to $C_{20}$ alkanediyl. In yet another preferred embodiment X is selected from a $C_2$ to $C_{16}$ alkanediyl, more preferably a $C_3$-$C_{12}$ alkanediyl, most preferably a $C_4$-$C_{10}$ alkanediyl. In yet another preferred embodiment, X is a linear alkanediyl.

More preferably, X is selected from alkanediyl groups having the general formula III:

wherein the index q is an integer of from 1 to 20, preferably 2 to 16 and most preferably 4 to 10. Most preferably, butane-1,4-diyl, hexane-1,6-diyl, or octane-1,8-diyl is used.

In yet another preferred embodiment X is $X^3$—O—$X^4$, with $X^3$ and $X^4$ being a linear or branched $C_1$-$C_9$ alkanediyl. Most preferably, X is selected from alkanediyl groups being interrupted by an oxygen atom of formula IV:

wherein the indices r and s are independently of each other integers of from 1 to 8, preferably 2 to 6 and most preferably 3 to 4.

In a second embodiment X may be selected from a $C_5$ to $C_{20}$ cycloalkanediyl, which may optionally be substituted and which may optionally be interrupted by up to 5 heteroatoms selected from O and N. Such cycloalkanediyl may be selected from single-ring cycloalkanes, such as but not limited to hexadecane, multi-ring cycloalkanes such as but not limited to bicyclohexyl, or poly-cyclic cycloalkanes like spiro alkanes, such as but not limited to spiro [4.4]nonane, orbridged-ring alkanes.

In a third embodiment X may be selected from a $C_6$ to $C_{20}$ organic group of formula —$X^1$-A-$X^2$—, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which H atoms may optionally be substituted and which C atoms may optionally be interrupted by up to 5 heteroatoms selected from O and N. In a preferred arylalkanediyl $X^1$ and $X^2$ may independently be selected from methanediyl, ethanediyl, propanediyl and butanediyl. In another preferred arylalkanediyl A is selected from benzene, anthracene, biphenyl, and naphthalene. Most preferably the arylalkanediyl is 1,4-xylenediyl.

In a fourth embodiment X may be selected from a polyoxyalkylene diradical of formula II:

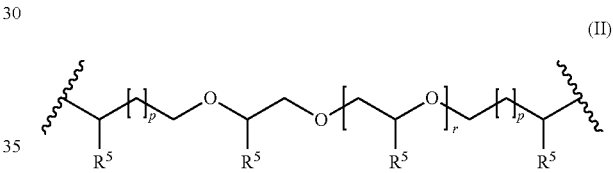
(II)

wherein p is 0 or 1, r is an integer of from 1 to 100; $R^5$ is selected from H and a linear or branched $C_1$ to $C_{20}$ alkyl group. Preferably r is an integer of from 1 to 50, more preferably of from 1 to 20, most preferably of from 1 to 10. Preferably $R^5$ is selected from H and a linear or branched $C_1$ to $C_6$ alkyl group, more preferably $R^5$ is H, methyl, ethyl or propyl.

In formula I $R^1$ and $R^2$ are monovalent groups independently selected from H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, which may optionally be further substituted. Such further substituents may preferably be hydroxyl, carboxy, carbonyl, amino, amido, sulphonamide, sulphonate, and phosphate. Most preferably $R^1$ and $R^2$ are unsubstituted or substituted by one or more hydroxy or amino groups. $R^1$ and $R^2$ may generally be identical or different.

In a first preferred embodiment, $R^1$ and $R^2$ are unsubstituted. In another preferred embodiment $R^1$ and $R^2$ are independently selected from $C_1$ to $C_{16}$ alkyl, more preferably $C_1$-$C_{12}$ alkyl, more preferably $C_1$-$C_{10}$ alkyl, most preferably methyl, ethyl, propyl or butyl. In yet another preferred embodiment, $R^1$ and $R^2$ are linear alkyl. Such alkyl may optionally be substituted by hydroxy (—OH), carboxy (CO—OH or its salts), amine (NH$_2$), amide (—CO—NH$_2$), sulphonamide (—SO$_2$—NH$_2$), sulphonate (—SO$_2$OH or its salts), sulphate (—OSO$_2$OH or its salts), phosphonate (—PO(OH)$_2$ or its salts) and phosphate (—O—PO(OH)$_2$, or its salts). A substitution is particularly useful in the use in cleaning compositions. In a preferred embodiment at least one of $R^1$ and $R^2$ is selected from $C_2$ to $C_{16}$ hydroxyalkyl, more preferable a $C_2$-$C_{12}$ hydroxyalkyl, and most preferably a $C_2$-$C_3$ hydroxyalkyl. In yet another preferred embodiment at least one of $R^1$ and $R^2$ is selected from formula V

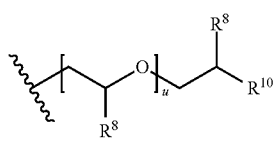

(V)

wherein u is an integer of from 0 to 100; $R^8$ is, for each repeating unit u independently, selected from H and linear or branched $C_1$ to $C_2$ alkyl, and $R^{10}$ is selected from hydroxy (—OH), carboxy (—CO—OH or its salts), amine (—NH$_2$), amide (—CO—NH2), sulphonamide (—SO$_2$—NH$_2$), sulphonate (—SO$_2$OH or its salts), sulphate (—OSO$_2$OH or its salts), phosphonate (—PO(OH)$_2$ or its salts) and phosphate (—O—PO(OH)$_2$, or its salts). Preferably u is an integer of from 4 to 50, more preferably of from 9 to 40, most preferably of from 19 to 30. Preferably $R^8$ is selected from H and methyl. $R^{10}$ is preferably selected from hydroxy, sulphonate, sulphate and phosphate.

In a particularly preferred embodiment at least one of $R^1$ and $R^2$ is selected from oxyethylene or oxypropylene homo or copolymers, which are terminated by groups $R^8$. Such copolymers may have random, block, alternating or gradient structure.

For use as a developer preferably $R^1$ is H and $R^2$ is selected from linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, which may optionally be further substituted. In a particular embodiment $R^2$ is independently selected from a $C_1$ to $C_{16}$ alkyl, more preferably a $C_1$-$C_{12}$ alkyl, more preferably a $C_1$-$C_{10}$ alkyl, most preferably methyl, ethyl, propyl or butyl. In yet another preferred embodiment $R^1$ and $R^2$ are linear alkyl.

In formula I $R^3$ and $R^4$ are monovalent groups independently selected from a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ polyoxyalkylene. Such polyoxyalkylene may be a homopolymer or a copolymer. Copolymers may be random, bock, alternating or gradient copolymers. Preferably the polyoxyalkylene group are chosen from compounds of formula V above, all of which may optionally be substituted, and wherein pair-wise $R^3$—$R^4$ and adjacent $R^4$—$R^4$ and $R^3$—$R^3$ may optionally together form a bivalent group X as defined above, and may also be a continuation Q of the molecule by branching, and, if n is equal to or greater than 2, $R^3$, $R^4$ or $R^3$ and $R^4$ may also be hydrogen atoms.

In a preferred embodiment $R^3$ and $R^4$ are selected from formula VI

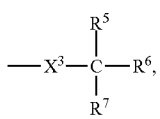

(VI)

wherein
$X^3$ is selected from a chemical bond and a linear or branched, preferably linear, $C_1$ to $C_4$ alkanediyl, most preferably methanediyl.

$R^5$ is selected from OH, H and a linear or branched $C_1$-$C_5$ alkyl, preferably methyl or OH,
$R^6$ is selected from H and a linear or branched $C_1$ to $C_{20}$ alkyl, a $C_1$ to $C_{20}$ cycloalkyl, a $C_1$ to $C_{20}$ aryl, $C_1$ to $C_{20}$ alkylaryl and $C_1$ to $C_{20}$ arylalkyl.
$R^7$ is selected from H and linear or branched $C_1$ to $C_{10}$ alkyl, preferably methyl or tert. butyl.

In another preferred embodiment $R^6$ is —(CH$_2$)$_m$—$R^7$, wherein
$R^7$ is selected from a $C_1$ to $C_{20}$ alkyl
m is an integer of from 1 to 10, preferably from 2 to 6, most preferably from 2 to 4

In a further preferred embodiment $R^3$ and $R^4$ are independently selected from formula VII

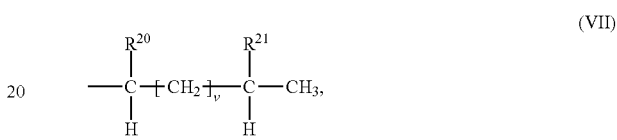

(VII)

wherein $R^{20}$ is selected from OH and H, $R^{21}$ is selected from H or $C_1$ to $C_{10}$ alkyl, and v is an integer of from 1 to 10, preferably from 1 to 6, most preferably from 2 to 4.

The $C_2$-$C_4$ polyoxyalkylene groups are preferably selected from the group consisting of homopolymers and copolymers of ethyleneoxide, propyleneoxide, butyleneoxide and styrene oxide, most preferably homopolymers and copolymers of ethyleneoxide and propyleneoxide.

The groups $R^3$ and $R^4$ consisting of polyoxyalkylene groups may have hydroxy groups as the terminal group. However, the terminal hydroxy groups or a part of the terminal hydroxy groups may be esterified by polybasic acids, preferably sulfuric acid and/or phosphoric acid, thereby obtaining anionic and/or potentially anionic groups, preferably sulphate and/or phosphate ester groups. The aforementioned cations may be used as the counterions for such anionic groups.

In another preferred embodiment $R^3$ and $R^4$ each belonging to the same N center may pair-wise together form a bivalent group X selected from butanediyl, pentanediyl, and hexanediyl.

Furthermore, adjacent $R^4$—$R^4$ and $R^3$—$R^3$ may optionally together form a bivalent group X as defined above. Structures like

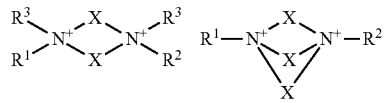

may be formed in this way.

It must be emphasized that $R^3$ and $R^4$ may individually form a continuation Q of the molecule by branching.

In the particular case that n is equal to or greater than 2, $R^3$, $R^4$ or $R^3$ and $R^4$ may be hydrogen atoms.

Any type of organic or inorganic anion Z customary and known in the field of quaternary ammonium salts may be used as counter-ion for the cation of the general formula I. Preferably, Z is an anion $Z^{x-}$ with x being selected from 1, 2, 3 or 4, preferably 1 or 2. Particular examples of suitable counter-ions are selected from hydroxide, chloride, bromide, nitrate, sulphate, monomethyl sulphate, formate, acetate and propionate ions without limiting the invention thereto. Preferably, monomethyl sulphate, sulphate or chloride is used as counter-ion. Moreover, they can contain the aforementioned anionic counter-ions.

For use in developer compositions hydroxide is the preferred counter-anion. For use in cleaning compositions the preferred counter-anions are selected from chloride, bromide, nitrate, sulphate, monomethyl sulphate, formate, acetate and propionate.

In the case of negatively charged substituents being present in the ammonium compound in excess to the positively charged N atoms, Z may also be a cation. In this case non-metal cations are preferred.

In a particular embodiment of the present invention $R^1$, $R^2$ are methyl, $R^3$ and $R^4$ together form a pentanediyl diradical in order to form a $C_6$ cyclic moiety with the N atom; X is 1,4-xylenediyl:

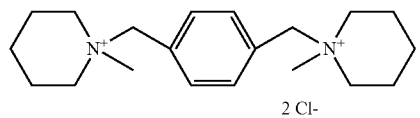

2 Cl-

In this case the chloride counter-ion may be exchange by any other counter-ion described above.

In another embodiment $R^1$, $R^2$ are methyl, $R^3$ and $R^4$ together form a butanediyl diradical in order to form a $C_6$ cyclic moiety with the N atom; X is butanediyl:

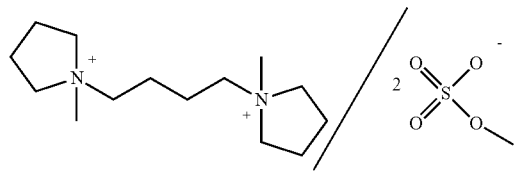

In this case the sulphate counter-ion may be exchange by any other counter-ion described above.

In yet another embodiment $R^1$=$R^2$=$R^3$=$R^4$ is ethyl and X is 1,4-xylenediyl:

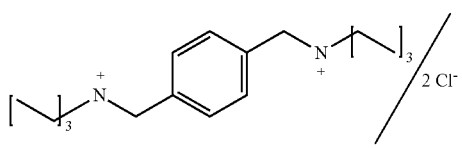

In this case the chloride counter-ion may be exchange by any other counter-ion described above.

In yet another embodiment $R^1$ is methyl, $R^2$ is benzyl, and two pairs of $R^3$ and $R^4$ together form a group X, and X is ethanediyl:

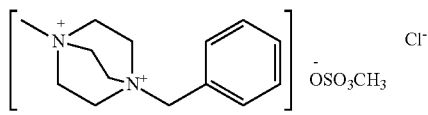

In this case the monomethyl sulphate and chloride counter-ions may be exchange by any other counter-ion described above.

In yet another embodiment $R^1$ is H, $R^2$ is methyl, and two pairs of $R^3$ and $R^4$ together form a group X, and X is ethanediyl:

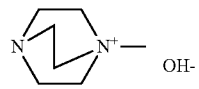

In this case the hydroxide counter-ions may be exchange by any other counter-ion described above.

In yet another embodiment $R^1$, $R^2$, $R^3$ and $R^4$ are methyl and X is propanediyl:

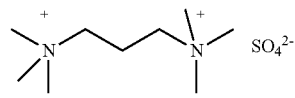

In this case the sulphate counter-ions may be exchange by any other counter-ion described above.

Other examples of particularly suitable gemini additives are those of formula I, wherein:
X is linear or branched $C_1$ to $C_{10}$ alkyl, preferably n-pentyl or n-hexyl,
$R^1$ and $R^2$ are selected from $C_1$ to $C_6$ alkyl, preferably methyl or ethyl,
$R^3$ is selected from formula IV or —$(C_2H_4$—$O)_x$—H,
$R^4$ is selected from formula IV or —$(C_2H_4$—$O)_x$—$SO_3$—
x is an integer from 10 to 40, preferably from 20 to 30.

The concentration of the gemini additives in the aqueous rinse solution primarily depends on the critical micelle concentration value (CMC value). Therefore, the concentration can vary broadly and, therefore, can be adapted most advantageously to the particular requirements of a given method of the invention. Preferably, the concentration is in the range of about 0.00005 to about 5% by weight, preferably about 0.0002 to about 2% by weight and, more preferably about 0.0005 to about 0.05, most preferably about 0.001 to about 0.01% by weight, the weight percentages being based on the complete weight of the solution.

The concentration of the gemini additives in the developer solution are typically in the range of about $1.0 \cdot 10^{-5}$ to about 1.5 N (based on ammonium groups or corresponding hydroxide), preferably about $1.0 \cdot 10^{-4}$ to about 1.0 N, more preferably about $1.0 \cdot 10^{-3}$ to about 0.8 N, most preferably about 0.05 to about 0.7 N.

The aqueous solution may contain water-miscible polar organic solvents. Examples of suitable solvents are described in US 2008/0280230 A, page 2, paragraph [0016]. Most preferably, the aqueous solution does not contain any organic solvents.

Further additive may be present in the cleaning solution according to the present invention. Such additives may be
(I) alcohols or amines in general to improve the wetting capabilities,
(II) buffer components for pH adjustment such as but not limited to ammonia containing buffers, tris-hydroxymethyl-aminomethane, most preferable sodium free buffer systems.
(III) One or more further surfactants, either non-ionic or cationic to improve surface tension and wetting capabilities.

In accordance with the method of the invention, the aqueous solution comprising the gemini additives may be used for different purposes and objects. Thus, it may be used as an immersion liquid for immersing photoresists during irradiation with actinic light through a mask, as a developer solution for photoresist layers exposed to actinic radiation through a mask and as a chemical rinse solution for rinsing the patterned material layers.

In one embodiment, the method for manufacturing integrated circuit devices, optical devices, micromachines and mechanical precision devices has been found, the said method comprising the steps of (1) providing a substrate having patterned material layers having line-space dimensions of 50 nm and less and aspect ratios of greater or equal 2;
(2) contacting the substrate at least once with an aqueous, solution containing at least one gemini additive as described herein, and
(3) removing the aqueous solution from the contact with the substrate.

In the third step of the method according to the invention, the aqueous solution is removed from the contact with the substrate. Any known methods customarily used for removing liquids from solid surfaces can be employed. Preferably, the solution S is removed by spin drying or drying processes making use of the Marangoni effect.

Preferably, in the first step of the method of the invention, the substrate is provided by a photolithographic process comprising the steps of (i) providing the substrate with an immersion photoresist, EUV photoresist or eBeam photoresist layer;
(ii) exposing the photoresist layer to actinic radiation through a mask with or without an immersion liquid;
(iii) developing the exposed photoresist layer with a developer solution to obtain a pattern having line-space dimensions of 50 nm and less, in particular, of 32 nm and less and, most especially, of 22 nm and less and an aspect ratio above 2, preferably above 10, even more preferably 50 and, most preferably, up to 75;
(iv) applying a chemical rinse solution to the developed patterned photoresist layer; and
(v) drying the semiconductor substrate after the application of the chemical rinse, solution preferably by spin drying or drying processes making use of the Marangoni effect.

Any customary and known positive or negative immersion photoresist, EUV photoresist or eBeam photoresist can be used. The immersion photoresist may already contain at least one fluorine-free cationic, anionic or amphoteric surfactant A. Additionally, the immersion photoresist can contain nonionic surfactants. Suitable nonionic surfactants are described, for example, in US 2008/0299487 A1, page 6, paragraph [0078]. Most preferably, the immersion photoresist is a positive resist.

Beside e-Beam exposure or extreme ultraviolet radiation of approx. 13.5 nm, preferably, UV radiation of the wavelength of 193 nm is used as the actinic radiation.

In case of immersion lithography preferably, ultra-pure water is used as the immersion liquid. More preferably, the immersion liquid contains at least one fluorine-free cationic, amphoteric or zwitterionic gemini additive.

Any customary and known developing composition can be used for developing the exposed photoresist layer. Generally, such developing compositions may comprise further additives. Preferably, aqueous developer solutions containing tetraalkylammonium hydroxides, such as but not limited to tetramethylammonium hydroxide (TMAH), are used. More preferably, the aqueous developer solutions contain at least one cationic, anionic, amphoteric or zwitterionic gemini additive.

Preferably, the chemical rinse solutions are aqueous solutions. Preferably, the chemical rinse solutions are applied to the exposed and developed photoresist layers as puddles.

It is essential for photolithographic process according to the method of the invention, that at least one of the following: the immersion solution, the developer solution or the chemical rinse solution contains at least one ionic gemini additive. Most preferably, the at least one cationic, anionic or amphoteric or zwitterionic gemini additive is contained in the chemical rinse solution.

Customary and known equipment customarily used in the semiconductor industry can be used for carrying out the photolithographic process in accordance with the method of the invention.

Without wishing to be bound by any theory, it is believed that the positive or negative electrical charge of the surface of the patterned layered materials causes a mutual electrostatic repulsion of neighbouring surfaces which prevents pattern collapse, as illustrated by FIG. 1.

BRIEF DESCRIPTION OF THE DRAWINGS

As FIG. 1 is of exemplary nature, the depicted spatial and dimensional relationships are not to be construed as an exact replica of the practical conditions.

In the Figures the reference numbers have the following meaning:
1 substrate,
2 photoresist patterns or high aspect ratio stack (HARS),
3 gemini additive,
4 cleaning solution containing Gemini additive.

EXAMPLES

Example 1

The manufacture of patterned photoresist layers having features with line-space structures and line-width of 40 nm and an aspect ratio of about 2.5 using surfactant (A1). The space between the photoresist lines was 80 nm.

Silicon wafers were provided with 100 nm thick layers of an immersion photoresist. The photoresist layers were exposed to UV radiation of a wavelength of 193 through a mask using ultrapure water as the immersion liquid. Thereafter, the exposed photoresist layers were baked and developed with an aqueous developer solution containing tetramethylammonium hydroxide (TMAH). The baked and developed photoresist layers were subjected to a chemical rinse treatment using a chemical rinse solution containing 0.002% by weight of surfactant (A1).

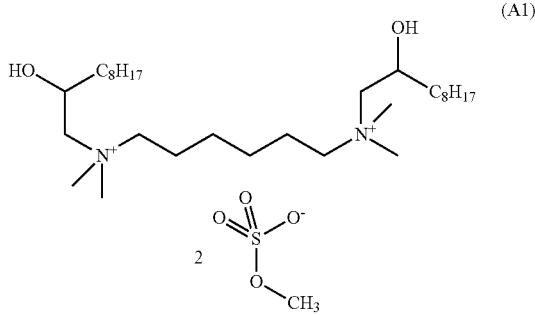

(A1)

The chemical rinse solution was applied on the wafer as a puddle. Thereafter, the silicon wafers were spun dry.

Figure 1:
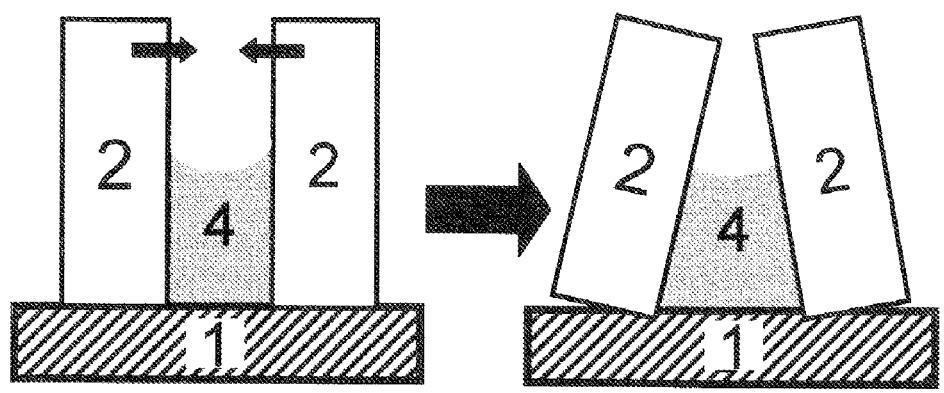
FIG. 1 illustrates how the photoresist structures or a high aspect ratio stacks 2 are drawn towards each other by the capillary forces of the evaporating cleaning solution 4, which capillary forces lead to pattern collapse.
Figure 2:
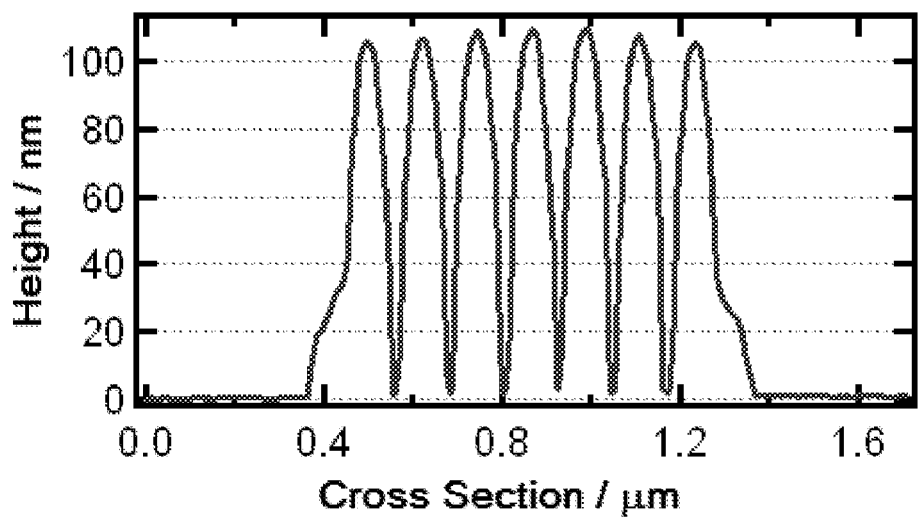
FIG. 2 shows the result of a rinse treatment of photoresist Line-Space structures by using gemini surfactant A1 according to example 1.

FIG. 2 shows the respective height profile measured by AFM after the rinse treatment by using gemini surfactant A1. The dried patterned photoresist layers having patterns with line-space dimensions of 40 nm and an aspect ratio of about 2.5 did not show any pattern collapse.

Example 2

Example 1 was repeated except that gemini surfactant A2 was used instead of gemini surfactant A1 in the chemical rinse solution.

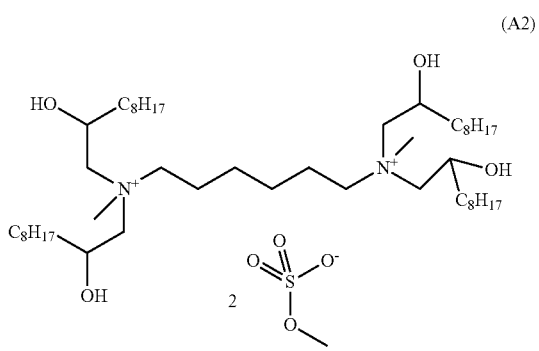

(A2)

Figure 3:
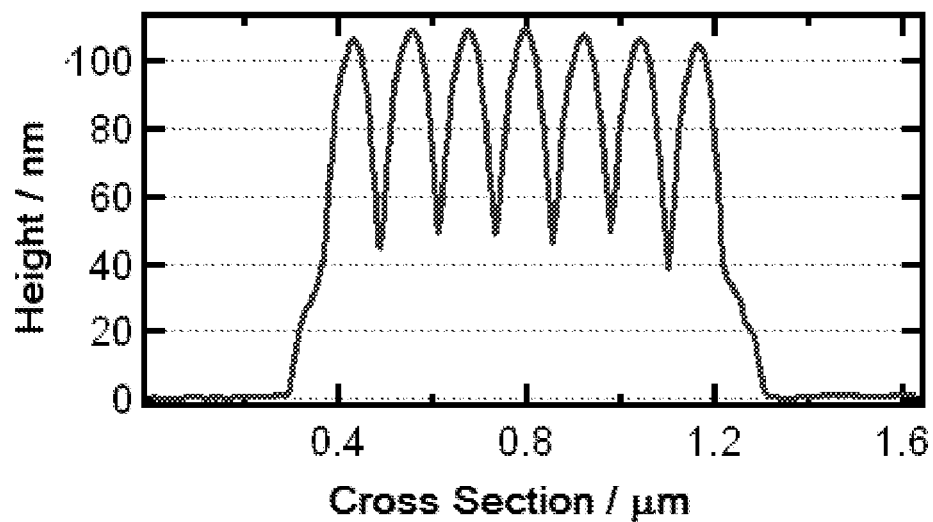
FIG. 3 shows the result of a rinse treatment of photoresist Line-Space structures by using gemini surfactant A2 according to example 2.

FIG. 3 shows the respective height profile measured by AFM after the rinse treatment by using gemini surfactant A2. The dried patterned photoresist layers having photoresist line-width dimensions of 40 nm and an aspect ratio of about 2.5 did not show any pattern collapse.

Example 3

Example 1 was repeated except that ultra pure water without any additive was used in the chemical rinse solution.

Figure 4:
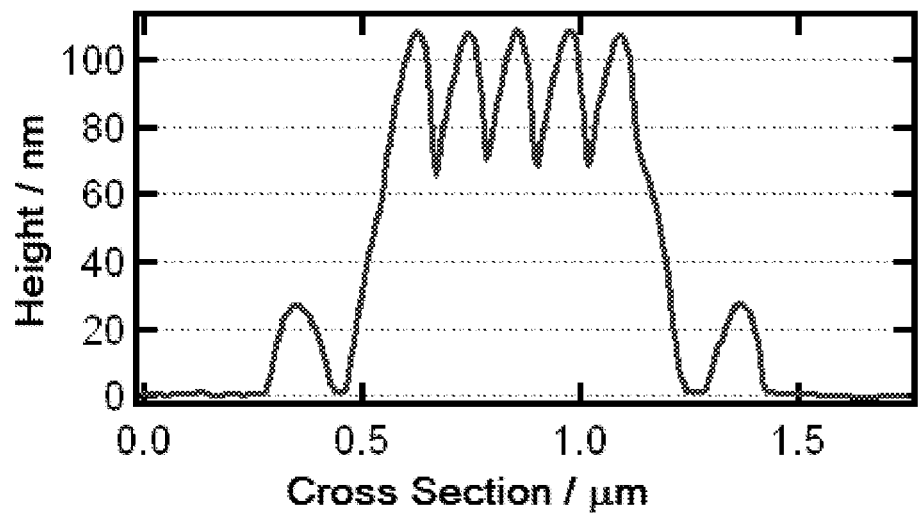
FIG. 4 shows the result of a photoresist development treatment by using utra pure water without any additive according to comparative example 3.

FIG. 4 shows the result of a photoresist development treatment by using ultra pure water without any additive. The dried patterned photoresist layers having photoresist line-width dimensions of 40 nm and an aspect ratio of about 2.5 showed significantly increased pattern collapse compared to the rinse according to examples 1 and 2.

The invention claimed is:
1. A method, comprising:
providing a patterned photoresist layer on a semiconductor substrate, wherein the patterned photoresist layer has line-space dimensions of 50 nm or less,
rinsing the patterned photoresist layer with an aqueous composition consisting essentially of at least one gemini additive of the formula I and water, wherein a pH of the aqueous composition is adjusted to a pH of about 6 to about 8 prior to the rinsing,

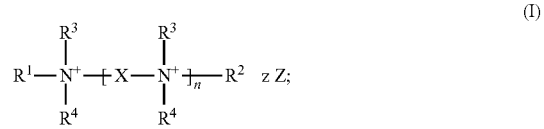

(I)

wherein
X is a divalent group, for each repeating unit 1 to n independently selected from the group consisting of
(a) a linear or branched $C_1$ to $C_{20}$ alkanediyl, which may optionally be substituted and which may optionally be interrupted by up to 5 heteroatoms selected from O, N, or both,
(b) a $C_5$ to $C_{20}$ cycloalkanediyl, which may optionally be substituted and which may optionally be interrupted by up to 5 heteroatoms selected from O, N, or both,
(c) a $C_6$ to $C_{20}$ organic group of formula —$X^1$-A-$X^2$—, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which may optionally be substituted and which C atoms may optionally be interrupted by up to 5 heteroatoms selected from O, N, or both, and
(d) a polyoxyalkylene diradical of formula II:

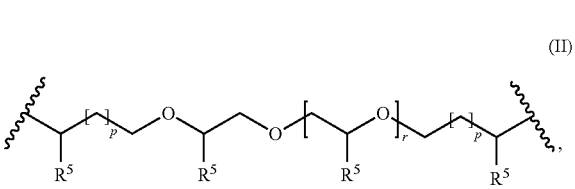

(II)

wherein p is 0 or 1, r is an integer from 1 to 100, and $R^5$ is H or a linear or branched $C_1$ to $C_{20}$ alkyl group;
$R^1$ and $R^2$ are monovalent groups independently selected from the group consisting of H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, and $C_2$ to $C_4$ oxyalkylene homo or copolymers, all of which may optionally be substituted;
$R^3$ and $R^4$ are monovalent groups independently selected from the group consisting of a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ oxyalkylene homo or copolymers, all of which may optionally be substituted, and wherein pair-wise $R^3$—$R^4$ and adjacent $R^4$—$R^4$ and $R^3$—$R^3$ may optionally together form a bivalent group X, and may also be a continuation Q of the molecule by branching, and, if n is equal to or greater than 2, $R^3$, $R^4$ or $R^3$ and $R^4$ may also be hydrogen atoms; or
$R^3$ and $R^4$ independently are represented by the formula VI:

(VI)

wherein
X³ is selected from a chemical bond and a linear or branched C₁ to C₄ alkanediyl,
R⁵ is selected from the group consisting of OH, H and a linear or branched C₁-C₅ alkyl,
R⁶ is selected from the group consisting of H, a linear or branched C₁ to C₂₀ alkyl, a C₁ to C₂₀ cycloalkyl, a C₁ to C₂₀ aryl, C₁ to C₂₀ alkylaryl and C₁ to C₂₀ arylalkyl,
R⁷ is selected from the group consisting of H and linear or branched C₁ to C₁₀ alkyl;
n is an integer from 1 to 5, and provided that, if a Q is present, n includes all repeating units of branches Q;
Q is

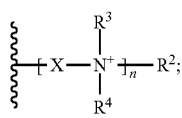

z is an integer, which is chosen so that the overall surfactant is electrically uncharged;
Z is a counter-ion.

2. The method according to claim 1, wherein X is selected from an unsubstituted linear or branched C₃-C₁₂ alkanediyl.

3. The method according to claim 1, wherein X is selected from the group consisting of butane-1,6-diyl, hexane-1,6-diyl, and octane-1,8-diyl.

4. The method according to claim 1, wherein X is selected from formula X³—O—X⁴, where X³ and X⁴ are a linear or branched C₁-C₉ alkanediyl.

5. The method according claim 1, wherein X¹ and X² are independently selected from the group consisting of methanediyl, ethanediyl, propanediyl and butanediyl and A is benzene or anthracene.

6. The method according to claim 1, wherein R¹ and R² are independently selected from C₁-C₁₂ alkanediyl.

7. The method according to claim 1, wherein R¹ is H and R² is independently selected from H, linear or branched C₁ to C₂₀ alkyl, C₅ to C₂₀ cycloalkyl, C₅ to C₂₀ aryl, C₆ to C₂₀ alkylaryl, C₆ to C₂₀ arylalkyl, C₁ to C₂₀ hydroxyalkyl, and C₂ to C₄ oxyalkylene homo or copolymers, all of which may optionally be substituted.

8. The method according to claim 1, wherein R³ and R⁴ independently are represented by the formula VI:

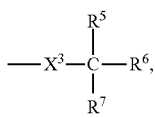

wherein
X³ is selected from a chemical bond and a linear or branched C₁ to C₄ alkanediyl,
R⁵ is selected from the group consisting of OH, H and a linear or branched C₁-C₅ alkyl,
R⁶ is selected from the group consisting of H, a linear or branched C₁ to C₂₀ alkyl, a C₁ to C₂₀ cycloalkyl, a C₁ to C₂₀ aryl, C₁ to C₂₀ alkylaryl and C₁ to C₂₀ arylalkyl,
R⁷ is selected from the group consisting of H and linear or branched C₁ to C₁₀ alkyl.

9. The method according to claim 1, wherein R³ and R⁴ independently are represented by the formula V:

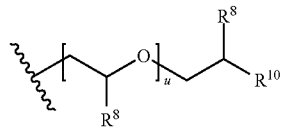

wherein
u is an integer of from 0 to 100;
R⁸ is, for each repeating unit u independently, selected from H and a linear or branched C₁ to C₂ alkyl group, and
R¹⁰ is selected from the group consisting of hydroxy, carboxy or its salts, amine, amide, sulphonamide, sulphonate or its salts, sulphate or its salts, phosphonate or its salts and phosphate or its salts.

10. The method according to claim 1, wherein the semiconductor substrate comprises structures comprising apertures of 30 nm or below.

11. The method according to claim 1 for cleaning the semiconductor substrate.

12. The method according to claim 1, wherein the patterned photoresist layer on the semiconductor substrate has line-space dimensions of 32 nm or less and aspect ratios of greater than 2.

13. The method according to claim 1, wherein the composition comprises, based on a complete weight of the solution, 0.0005 to 1% by weight of the gemini additive.

14. The method according to claim 1, wherein the semiconductor substrate is manufactured by a photolithographic process comprising:
(i) exposing a photoresist layer on the semiconductor substrate to actinic radiation through a mask with or without an immersion liquid;
(ii) developing the exposed photoresist layer with a developer solution to obtain a developed patterned photoresist layer having line-space dimensions of 32 nm or less and an aspect ratio >2;
(iii) applying a chemical rinse solution to the developed patterned photoresist layer; and
(iv) spin drying the semiconductor substrate after the application of the chemical rinse solution;
wherein at least one of the immersion liquid and the chemical rinse solution, is an aqueous solution comprising the gemini additive.

15. The method according to claim 1, for preventing pattern collapse, for reducing line edge roughness, for preventing and removing watermark defects and for reducing defects by removing particles.

16. A method, comprising:
providing a substrate having a patterned photoresist layer having line-space dimensions of 50 nm or less and aspect ratios of at least 2;
contacting the substrate at least once with an aqueous solution consisting essentially of at least one gemini additive of the formula I and water, wherein a pH of the aqueous composition is adjusted to a pH of about 6 to about 8 prior to the contacting:

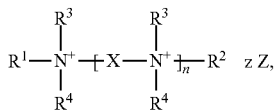

wherein

X is a divalent group, for each repeating unit 1 to n independently selected from the group consisting of:
(a) a linear or branched $C_1$ to $C_{20}$ alkanediyl, which may optionally be substituted and which may optionally be interrupted by up to 5 heteroatoms selected from O, N, or both,
(b) a $C_5$ to $C_{20}$ cycloalkanediyl, which may optionally be substituted and which may optionally be interrupted by up to 5 heteroatoms selected from O, N, or both,
(c) a $C_6$ to $C_{20}$ organic group of formula $-X^1-A-X^2-$, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which may optionally be substituted and which C atoms may optionally be interrupted by up to 5 heteroatoms selected from O, N, or both, and
(d) a polyoxyalkylene diradical of formula II:

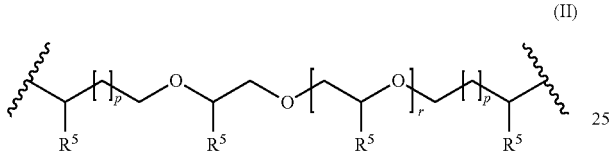

(II)

wherein p is 0 or 1, r is an integer from 1 to 100, and $R^5$ is H or a linear or branched $C_1$ to $C_{20}$ alkyl group;

$R^1$ and $R^2$ are monovalent groups independently selected from the group consisting of H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, and $C_2$ to $C_4$ oxyalkylene homo or copolymers, all of which may optionally be substituted;

$R^3$ and $R^4$ are monovalent groups independently selected from the group consisting of a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ oxyalkylene homo or copolymers, all of which may optionally be substituted, and wherein pair-wise $R^3-R^4$ and adjacent $R^4-R^4$ and $R^3-R^3$ may optionally together form a bivalent group X, and may also be a continuation Q of the molecule by branching, and, if n is equal to or greater than 2, $R^3$, $R^4$ or $R^3$ and $R^4$ may also be hydrogen atoms; or $R^3$ and $R^4$ independently are represented by the formula VI:

(VI)

wherein $X^3$ is selected from a chemical bond and a linear or branched $C_1$ to $C_4$ alkanediyl, $R^5$ is selected from the group consisting of OH, H and a linear or branched $C_1$-$C_5$ alkyl, $R^6$ is selected from the group consisting of H, a linear or branched $C_1$ to $C_{20}$ alkyl, a $C_1$ to $C_{20}$ cycloalkyl, a $C_1$ to $C_{20}$ aryl, $C_1$ to $C_{20}$ alkylaryl and $C_1$ to $C_{20}$ arylalkyl, $R^7$ is selected from the group consisting of H and linear or branched $C_1$ to $C_{10}$ alkyl;

n is an integer from 1 to 5, and provided that, if a Q is present, n includes all repeating units of branches Q;

Q is

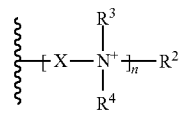

z is an integer, which is chosen so that the overall surfactant is electrically uncharged; Z is a counter-ion; and removing the aqueous solution from the contact with the substrate, wherein the substrate from which the aqueous solution has been removed from the contact with the substrate, is essentially free from a collapsed pattern.

* * * * *

UNITED STATES PATENT AND TRADEMARK OFFICE
CERTIFICATE OF CORRECTION

PATENT NO. : 10,385,295 B2
APPLICATION NO. : 14/412737
DATED : August 20, 2019
INVENTOR(S) : Andreas Klipp et al.

It is certified that error appears in the above-identified patent and that said Letters Patent is hereby corrected as shown below:

On the Title Page

Column 2, item (57), abstract, Line 7:

" 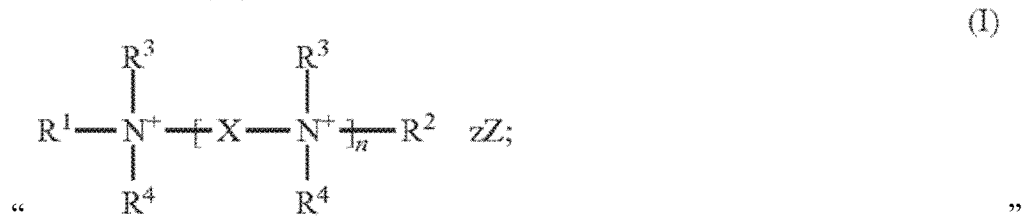 (I) "

Should read:

--  (I); --;

In the Specification

Column 3, Line 1:
"stearyldimethylbenzylammoium,"
Should read:
-- stearyldimethylbenzylammonium, --;

Column 8, Line 12:
"orbridged-ring alkanes."
Should read:
-- or bridged-ring alkanes. --;

Signed and Sealed this
Sixteenth Day of June, 2020

Andrei Iancu
*Director of the United States Patent and Trademark Office*

CERTIFICATE OF CORRECTION (continued)
U.S. Pat. No. 10,385,295 B2

Column 10, Line 7:
"tert. butyl."
Should read:
-- tert butyl. --;

Column 10, Line 12:
"from 2 to 4"
Should read:
-- from 2 to 4. --;

In the Claims

Column 17, Claim 5, Line 34:
"according claim 1"
Should read:
-- according to claim 1 --.